United States Patent [19]

Parsons et al.

[11] 4,321,687

[45] Mar. 23, 1982

[54] TIMING PULSE GENERATION

[75] Inventors: Raymond L. Parsons; Paul H. Paulsen, both of Tucson, Ariz.

[73] Assignee: International Business Machines Corporation, Armonk, N.Y.

[21] Appl. No.: 80,873

[22] Filed: Oct. 1, 1979

[51] Int. Cl.[3] .......... G04F 5/00; G06F 1/04

[52] U.S. Cl. .......... 364/900; 307/269; 328/62; 328/63; 368/155

[58] Field of Search ... 364/200 MS File, 900 MS File; 235/92 SH, 927, 92 PE; 307/362, 221 R, 269; 328/132, 114, 37, 62, 63, 49; 368/251, 10, 12, 200, 155, 156

[56] References Cited

U.S. PATENT DOCUMENTS

| | | | |
|---|---|---|---|
| 3,434,115 | 3/1969 | Chomicki | 364/900 |
| 3,621,403 | 11/1971 | Sely | 328/61 |
| 3,771,144 | 11/1973 | Belady et al. | 364/200 |
| 3,781,529 | 12/1973 | Abramson et al. | 238/92 GA |
| 3,842,347 | 10/1974 | Terbrack | 324/78 D |
| 3,851,120 | 11/1974 | Crosley | 235/92 T |
| 3,866,022 | 2/1975 | Fletcher et al. | 235/92 T |
| 3,903,515 | 9/1975 | Haydin et al. | 340/309.4 |
| 3,942,171 | 3/1976 | Haraszti et al. | 207/221 R |
| 3,986,333 | 10/1976 | Kimura et al. | 235/92 T |
| 3,999,050 | 12/1976 | Pitroda | 364/900 |
| 4,101,761 | 7/1978 | Merryman | 235/92 CA |
| 4,104,865 | 8/1978 | Sasaki | 368/251 |
| 4,144,447 | 3/1979 | Fossum et al. | 235/92 T |
| 4,161,787 | 7/1979 | Groves et al. | 235/92 T |
| 4,162,610 | 7/1979 | Levine | 368/10 |
| 4,168,531 | 9/1979 | Eichelberger et al. | 235/92 PE |
| 4,220,990 | 9/1980 | Alles | 364/200 |

FOREIGN PATENT DOCUMENTS 1381159 1/1975 United Kingdom .
1484155 9/1977 United Kingdom .

OTHER PUBLICATIONS

IBM Technical Disclosure Bulletin, vol. 11, #8 , Jan. 1969, pp. 959, 960, Holmstrom "Programmable Time". IEEE Transactions, Ind. Elec. & Contr. Instr., vol. 1EC1-25, #1, Feb. 1978, Saint-Hilaire et al., pp. 3-10. IBM Tech. Disc. Bul., vol. 18, No. 11, "Multiple Timer Service", Callahan et al., Apr. 1976, pp. 3608-3609. IBM Tech. Discl. Bul., vol. 19, No. 10, "Timer External Clock and Gate", Bourke et al., Mar. 1977, pp. 3648-3650.

*Primary Examiner*—Gareth D. Shaw
*Assistant Examiner*—Eddie P. Chan
*Attorney, Agent, or Firm*—Herbert F. Somermeyer

[57] ABSTRACT

Clock pulse plural cascade connected counters generate a plurality of patterns. Upon each clock pulse, the patterns in the plurality of counters are captured in a like plurality of registers. Each of the captured counts are then compared with one or more bit masks for determining identity. Detection of identity between any one of the plurality of masks with the selected ones of the registers results in the emission of a timing pulse. The initial counter states and the various mask values in the mask sets for the respective registers are program loaded. The apparatus can be computer monitored or can be programmed within a digital computer. Accordingly, the timing intervals are programmable by selecting diverse time-out lists.

9 Claims, 3 Drawing Figures

TIMING PULSE GENERATION

BACKGROUND OF THE INVENTION

The present invention relates to programmed timing control and more particularly wherein the programmability of the time of occurrence of the pulse is generated by a combination of reference masks or patterns with a generated pattern.

In microprocessor controlled apparatus, requirements arise for the timing of events. As microprocessor capability continually increases, the number of apparatus and the number of events controlled by a microprocessor greatly increase. Since many apparatus and processors have critical times for the initiation of diverse functions, requirements for generating timing pulses in an inexpensive and flexible manner has greatly increased. The generation of such timing pulses should reach a minimal system cost by an astute collection of hardware and computer programming. A timing pulse generation method for enabling such selections is needed in the microprocessor area.

Timing devices are known which measure a plurality of elapsed times; that is, a continuously running clock supplies timing signals to a plurality of memory devices which store the elapsed time on the occurrence of any of a plurality of events. The respective memory is then latched to the time stored in memory. In this manner, the time of event is accurately recorded. This apparatus, however, does not provide for the selective generation of timing pulses, it only measures what has occurred. It also does not provide for successive timed actuations via highly flexible programmable relationships.

Computerized timers, of course, are known. External counters are known to be program loaded by a computer. In such apparatus, a clock drives the program loaded counter to zero which then interrupts the computer. This, however, required one counter for each timing pulse. As the number of timing pulses required continually increases, this arrangement becomes unduly expensive or on the other hand, to utilize that in a program, requires a lot of attention to the elapsed time of program execution. As programs are changed, such elapsed times can also change. Therefore, the maintenance and improvement of programs in such a situation becomes unduly burdensome.

Multiple timing in computerized systems includes measuring elapsed times of subroutines. This again, as in the first illustration, only measures actual elapsed time. It does not provide for flexible generation of timing pulses independent of other events.

SUMMARY OF THE INVENTION

It is an object of the present invention to provide a highly programmable and flexible timing pulse generator for generating a multiplicity of pulses, the times of occurrence of which are highly programmable.

In conjunction with the preceding object, it is another object of the invention to provide a method and apparatus for generation of multiple timing pulses which is easily programmable in a digital computer, easily implemented in hardware circuits or by a judiciously selected program and hardware combinations.

A multiple timing pulse generator includes a highly programmable timing interval generator which identifies a plurality of intervals by multi bit patterns, the elapsed time between successive ones of said multibit patterns being programmable. Upon the occurrence of a driving clock pulse, the then generated multiple multibit patterns are captured in a plurality of registers. The captured multibit patterns are then selectively compared with one or more mask sets. The number of masks in each set being selectable such that each series of multibit patterns can generate a programmable number of timing pulses. Upon a comparison of a mask in any mask set with the corresponding captured multibit pattern results in the generation of a timing pulse.

The method and apparatus of the invention can be employed in either hardware or programmed in a programmable unit such as a Neuman type computer, programmable logic array and the like.

The foregoing and other objects, features and advantages of the invention will now be apparent from the following more particular description of preferred embodiments of the invention as illustrated in the accompanying drawings.

THE DRAWINGS

DETAILED DESCRIPTION

Figure 1:
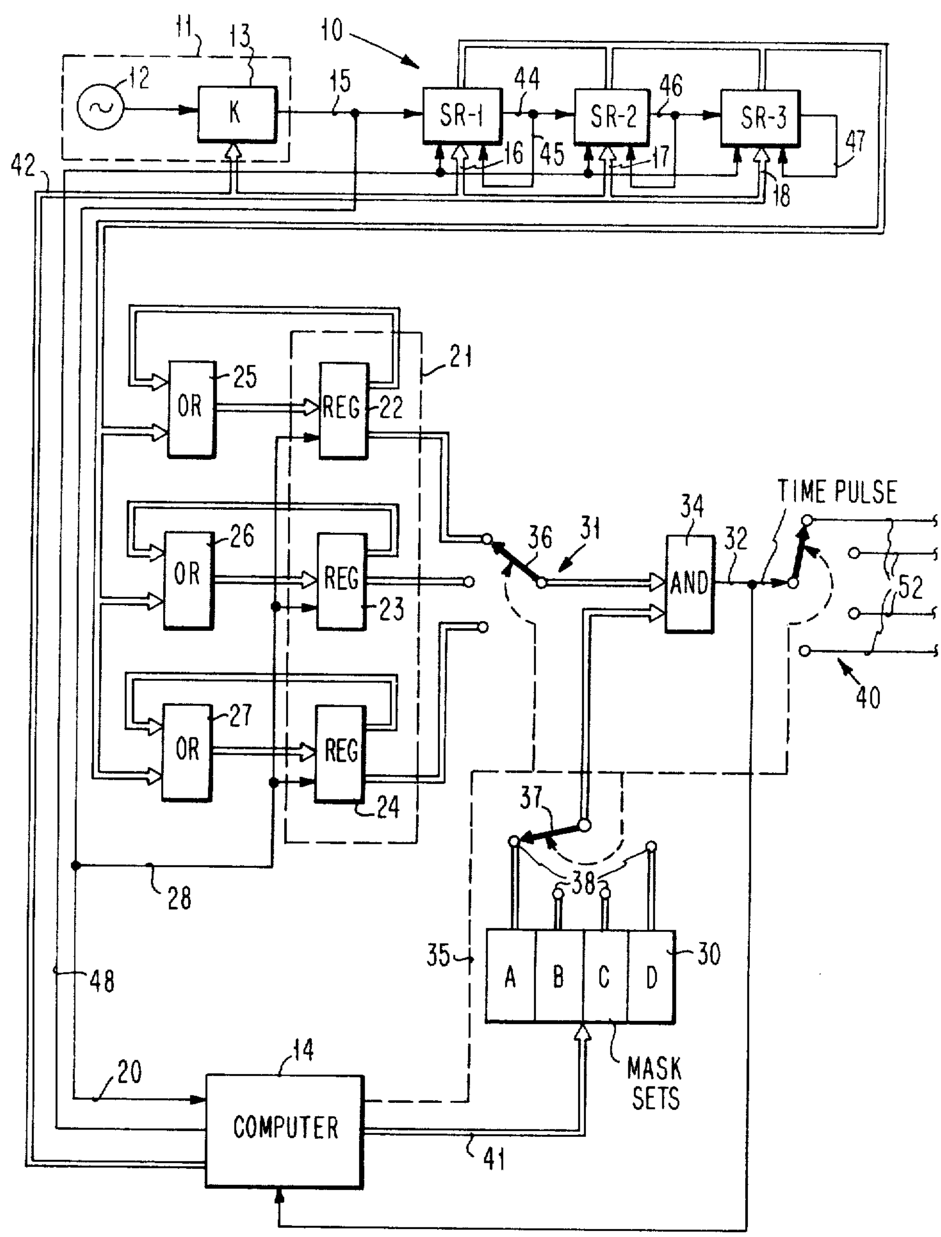
FIG. 1 is a diagrammatic showing of a first version of the present invention.

Referring now more particularly to the drawings, like numerals indicate like parts and structural features in the various diagrams. The multiple pulse timer of FIG. 1 includes a shift register type of multibit pattern generator 10 driven by clock pulse generator 11. Clock pulse generator 11 includes an oscillator 12 supplying high frequency pulses to counter K 13. As will become apparent, K 13 is loaded under program control of computer 14 for determining the periodicity of the pulses supplied over line 15. Multibit pattern generator 10 includes shift registers SR1, SR2 and SR3 constructed using known shift register techniques. Each of the shift registers contain a multibit pattern indicative of elapsed time as measured by the number of pulses on line 15; the elapsed time being determined by the initial pattern in each of the shift registers plus the time interval between pulses on line 15. SR1, SR2, SR3 are all initially loaded by computer 14 via cable 16, 17 and 18, respectively. In a simple pattern, one selected bit position in each of the registers SR1, SR2, SR3 is set to unity.

Each time generator 11 receives a pulse on line 15, computer 14 also receives the pulse over line 20. Simultaneously multibit pattern memory means 21 receives and stores the multibit patterns then in shift registers SR1, SR2 and SR3. Memory means 21 consists of three registers 22, 23, 24 which respectively receive the multibit patterns through multielement OR circuits 25, 26, 27 respectively from SR1, SR2, SR3. The pulse on line 15 also travels over line 28 to enable registers 22, 23, 24 to receive the signals from the three shift registers. The OR circuits 25, 26, 27 combine the multibit pattern in an OR logic function with the present pattern in the respective register. In this manner, the pattern of successive timing pulses are accumulated in the respective registers. Dispensing with the logic OR circuits 25, 26, 27 adds additional flexibility in that the multibit patterns are not cumulative but are generated in the three shift registers SR1-3. The electrical connections between shift registers SR1-3 to OR circuits 25–27 are direct and individual; i.e., the connections are not over a common bus. The single cable of FIG. 1 includes all the individual connections.

Each time computer 14 receives the interrupt signal over line 20, it programmably controls the comparison of the multibit patterns in registers 22–24 with a plurality of multibit masks stored in a memory 30 as sets of masks. Under computer 14 control, the multibit masks are fetched from memory 30 and serially supplied to multibit comparator 31. The multibit masks are compared with the patterns stored in registers 22–24 for generating a timing pulse over line 32. The line 32 timing pulse is supplied to utilization means (not shown in FIG. 1) as well as to computer 14.

Comparator 31 consists of electronic circuits represented by the diagrammatic symbols of switches 36, 37. Switches 36, 37 scan registers 22–24 synchronously with memory 30 registers using known scanning techniques. A multiple AND circuit 34 does the actual comparison and generation of timing pulses. Computer 14 supplies scan control signals over a plurality of lines represented by lines 35 to actuate the pair of scanning switches 36 and 37. Scanning switch 36 scans registers 22–24 to supply the multibit patterns for comparison by AND circuits 34. Switch 37 in turn selects which multibit mask set is to supply a multibit mask for comparison with the selected multibit pattern. Internal to memory 30, under computer 14 control, the multibit masks in each of the sets is supplied serially to the respective terminals 38 of scanning switch 37. As shown, switch 36 is set to receive the multibit pattern from register 22 and compare it to a multibit mask from mask set A under computer scanning control. The pulse on line 32 informs computer 14 a time out has occurred and a pulse has been generated. Then computer 14 may want to alter position of switch 40 to supply the next timing pulse over a different line. Switch 40 is, of course, an electronic switch.

Computer 14 then actuates switches 36, 37 in either a serial or random manner until all of the multibit masks in memory 30 have been used in comparison with one or more of the multibit patterns in registers 22, 23, 24. For example, there may be three multibit masks in set A, two in set B, two in set C and three in set D. Under computer 14 control, the certain timing operation may require the patterns of sets C and D or only C but not D. Accordingly, depending upon the process or process portion being controlled, the mask sets can be substituted for each other for programming different series of timing pulses. Also at the beginning of each timing cycle, computer 14 supplies a set of multibit masks over cable 41 to memory 30 for use in subsequent timing operations. At times selected by computer 14, the multibit patterns are supplied over cables 16, 17, 18 to the three shift registers SR1-3 and over cable 42 to K 13. Accordingly, each cycle of the time can be programmed to perform different timing generations or the timing generation can be completely the same over a series of repetitions.

Turning now to multibit pattern generator 10, the timing pulses on line 15 actuate SR1 to shift one position. In a most simple embodiment, SR1 will contain a single binary one with the rest 0's. When the single 1 has been shifted throughout the bit positions of SR1, a pulse signal is supplied as a carry signal over line 44 which is then reentered to SR1 in the lowest digit position over line 45 to be shifted again from the current of timing pulse on line 15. The signal on line 44 travels to SR2 to act as a timing pulse for that shift register. Therefore, SR2 shifts one each time SR1 shifts through its cycle; however, the cycling of SR2 can be increased by placing two ones in SR1. For example, if SR1 is a 4-bit register, two ones are placed in the first and third position. The logical effect of this is to reduce the length of SR1 to two bits. SR2 operates identically to SR1 and supplies signals over line 46 to shift SR3 one position; therefore, SR3 is shifted once for the total interval of SR1 and SR2. SR3 in turn supplies an output pulse over line 47 which is reentered to SR3. Without intervention of computer 14, multibit patterns of SR1, SR2, SR3 would cycle indefinitely. Therefore, one of the patterns in SR3 can be used as a stop pattern for stopping the timing cycle, if that is desired. Differing timings require different shift register lengths as well as different number of shift registers. The shift registers can have a different number of bits.

Computer 14 also supplies an enabling signal over line 48 to SR1-3 for enabling the shifting operations by making line 48 three lines and timing the operation of those three lines, the intervals of SR1, SR2 and SR3 can be programmably changed during the cycle. However, the timing generation of this very programmable system would rarely require such intervention by the computer although it is capable of doing so.

As mentioned above, each of the SR's would have a single bit for generating successively increasing time intervals. The SR1-3 can be constructed as a linear feedback shift register wherein complex patterns are generated with the clocking output signals on lines 44 and 46 being taken from one or more of the stages in such a linear feedback register. Other configurations can also be envisioned. In any event multibit patterns generated by generator 10 are timed dependent on the timing of pulses on line 15 and the initial patterns in the three shift registers as well as the constructional features of those registers. Those program multibit patterns are then compared with the program multibit mask for yielding an ultimate in flexible timing pulse generation.

Figure 2:
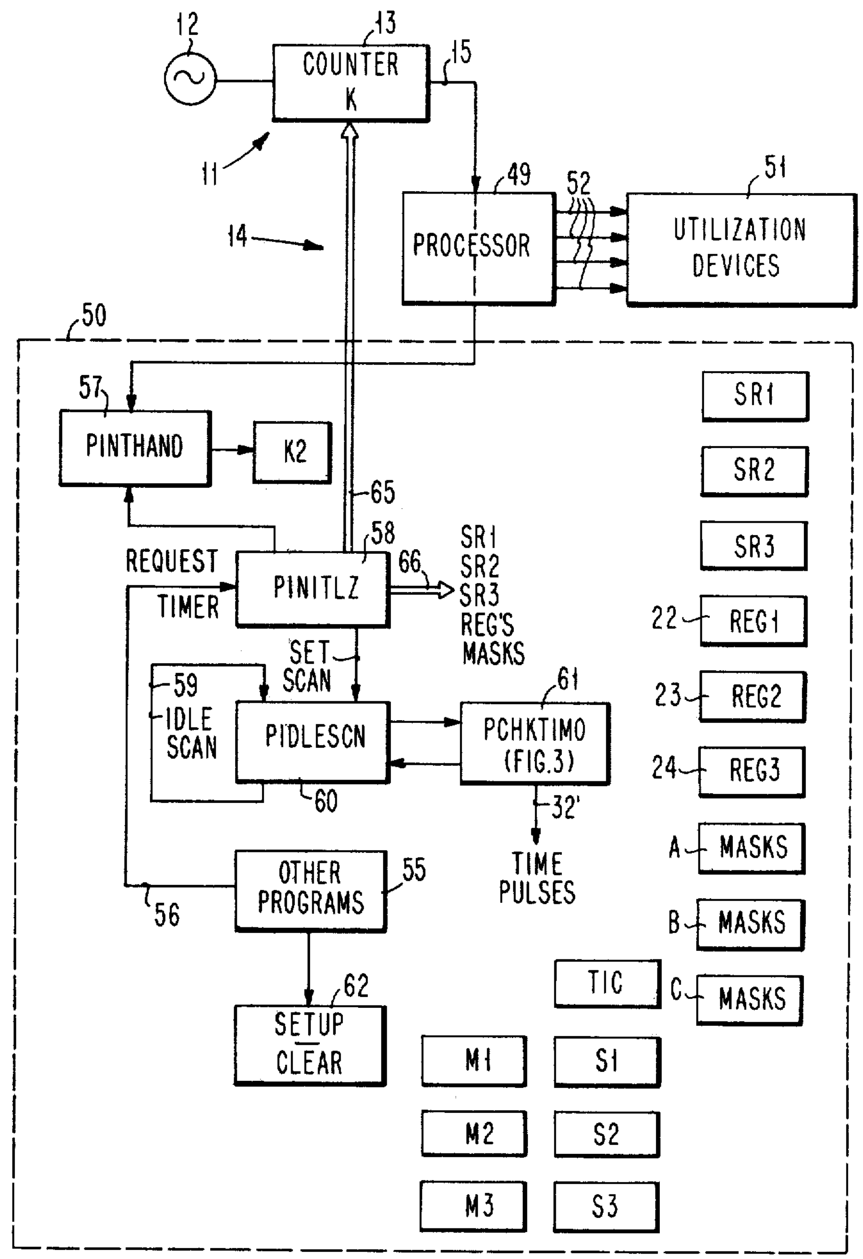
FIG. 2 is a second and best mode presentation of the invention showing a programmable implementation of the invention which corresponds with the arrangement shown in FIG. 1.

FIG. 2 illustrates a microprocessor programmed equivalent of the FIG. 1 illustrated embodiment. While all the elements 16 are program elements, clock 11 supplies its pulses over line 15 to processor 49 of computer 14 for interrupting same, as is well known. Processor 49 is connected to utilization devices 51 via a plurality of lines 52 corresponding to the output lines from switch 40 in FIG. 1. Computer 14 not only includes processor 49 but memory 50, such as any random access memory, containing a set of computer programs of instructions and memory registers for containing constants and operands. The operation of processor 49 with memory 50 is well known and not further described for that reason.

Figure 3:
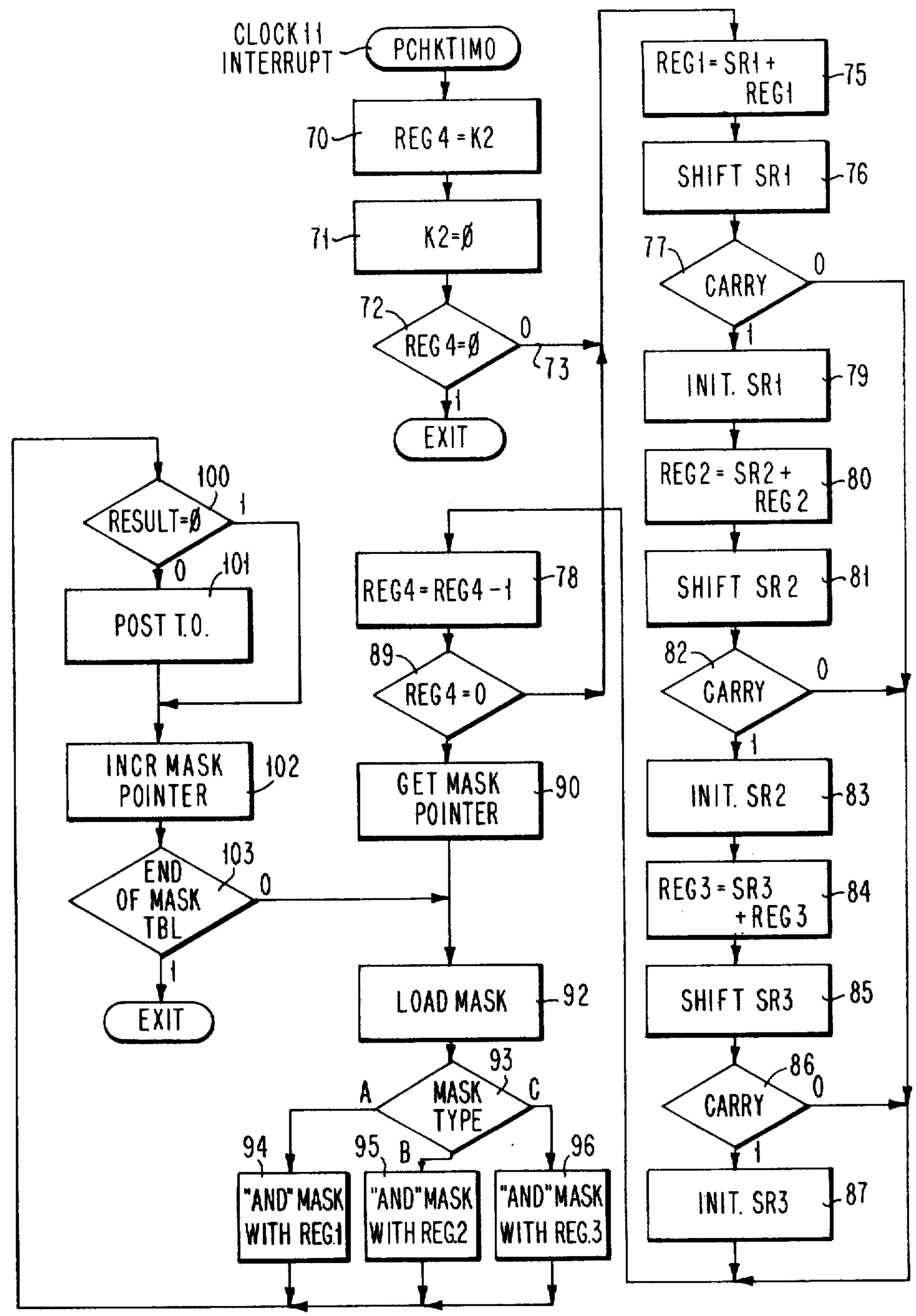
FIG. 3 is a flow chart illustrating instruction level steps for generating programmable multibit patterns and capturing the multibit patterns in a plurality of registers and enabling recycling of the sequence.

In general, the computer 14 operates on a relatively large set of computer programs of instructions as designated by numeral 55. Such programs can include sequences of computer functions which are used for controlling numerically controlled machines, computer peripheral equipment, chemical processes, vehicles of all types and the like. Many of these programs when in a machine controlled environment utilize sets of control effecting timing pulses. To set up a timing sequence, a request for the timer is issued via a branch instruction diagrammatically represented by line 56 which is to request a timer operation. In a programmed embodiment counter K2 is represented by a memory register controlled by the processor 49 utilizing computer program PINTHAND 57. This program is enabled by an initialize routine PINITLZ 58. Program 58 initializes the three shift registers SR1-3, the three multibit pattern registers 22–24, and all of the multibit mask in sets A, B. Idle scan program loop 59 includes short subroutine PIDLESCN 60, a subroutine that initiates operation in the computer to practice the present invention. Idle scan program loop 59 is a routine which enables processor 49 to scan for work; therefore, insertion of routine 60 into the idle scan loop 59 is the mechanism for referring to the sequences of computer program instructions that implement the invention. Routine 60 calls program sequence PCHKTIMO 61, detailed in FIG. 3. When processor 49 executes PCHKTIMO, it can emit timed pulses over lines 52 to utilization devices 51. Such pulse generation, as described later with respect to FIG. 3, is indicated by line 32' which represents a timing flag set within the memory 50. Another program such as a program of other programs 55 sense the flag for generating the pulse using well known program control and outputting techniques.

In addition to all of the above, it is desired to have a flexible setup for adjusting the timing operation. Along these lines, program 62 provides setup and clear functions for introducing time delays, and clearing out time delays, inserting a location where timing pulses should be emitted, such as adding the mask, deleting timing pulses by deleting a mask and the like. Since setting up tables and the like are well known in the computer arts, and their understanding of the set up routine and clear routine 62 is not germane to the understanding of the invention, further discussion is dispensed with.

The request timer instruction 56 invokes program 58 for initializing timer operation. In the simple embodiment wherein SR1-3 act as cascaded counters, program 58 merely inserts a 1000 pattern in each of the shift registers (3 4-bit shift registers). Registers 22–24 are set to 0. Mask set A-C receive mask sets respectively from registers M1 through M3 which have received bit patterns, via program 62. As mentioned for the FIG. 1 illustrated embodiment, several multibit masks may reside in each of the sets A-C. Similarly, registers S1-S3 contain arbitrary patterns for presetting SR1-SR3. Further register TIC contains a number to determine the length of count of K13. Program 58 loads K13 as indicated by cable 65 whereas the other registers are loaded via cable 66, both cables representing a series of program steps. In a practical embodiment, interrupt masking, program status, and so forth are involved in all of the programming. However, for purposes of simplicity and understanding, such well known computer program techniques have been omitted from the above description. It is seen that program 58 merely acts as a reference table and inserts multibit patterns into the registers associated with the programs implementing the timing functions. For that reason, program 58 is not described.

Program 58 also sets a bit for enabling program 57 to respond to K13 pulses on line 15 to invoke PCHKTIMO 61 via PIDLESCN 60.

PIDLESCN 60 merely consists of a branch and return instruction for sensing the program 57 detected K15. The set scan branches to an instruction which calls PCHKTIMO 61. When PCHKTIMO 61 finishes, the processor 49 returns to PIDLESCN 60 and thence to idle scan 59. PINTHAND counts line 15 interrupts in K2. The number in K2 is compared by execution of PCHTIMO 61, as described with respect to FIG. 3. FIG. 3 is an instruction level flow chart representative of the computer program instructions in routine 61. The first instruction 70 causes processor 49 to fetch the contents of K2 and store the contents in work register 4. Then at instruction 72, processor 49 checks the contents of register 4. If it is 0, timing sequences have been completed or no timing is currently being performed; processor 49 then exits at 72 returning to PIDLESCN 60. At this point also, a flag can be set for informing other programs 55 that the timing sequence requested via instruction at 56 has been completed. When K2 has a non-zero entity, processor 49 follows program path 73 to a reentrant program counting loop performing the function of multibit pattern bit generator 10 (FIG. 1) and memory means 21 (FIG. 1). Counting loop 75–79 (FIG. 3) performs a timing function by downcounting the value from K2 to 0 with the number of instructions in the loop determining the elapsed time. Therefore, counting loop 75–79 upon receiving a request pulse from PINTHAND 57 times through a series of pulse generating instructions as the pulses were generated by SR1, SR2 and SR3 of FIG. 1.

Instruction 75 ORs SR1 into register 22 (REG-1) and stores the result in register 22. This action corresponds to the FIG. 1 updating of its register 22. Then the signal contents of SR1 are shifted by processor 49 via instruction 76. Branch instruction 77 enables processor 49 to check for a SR1 carry which corresponds to the FIG. 1 carry at line 44. In most processors including processor 49, the shift instruction can generate a carry in an arithmetic logic unit (ALU) (not shown) which enables processor 49 via instruction 77 to check for the carry. If there is no carry, then the counting sequence stops, with a carry the counting sequence also includes execution of instructions 79–87.

The K2 count in register 4 is decremented by processor 49 at instruction 78. Then instruction 89 checks for register 4 contents equaling zero. If not zero, instruction 75 is again executed to initiate more counting.

Instructions 79–82 correspond to SR2 of FIG. 1. Instruction 79 resets SR1 of FIG. 2 to its initial value. Instruction 80 OR's the contents of SR2 with the contents of register 23 with the results stored in register 23. The contents of SR2 are shifted at 81 with the carry sensed at 82. If there is no carry, then instruction 78 is executed. On counting sequence loop may include several iterations of these instruction loops.

When a carry is detected at instruction 82, the contents of SR2 are initialized to the original value by instruction 83. Then the signal contents of SR3 are logically ORed with register 24 and stored in register 24, all by instruction 84. Then the signal contents of SR3 are shifted at 85; carry checked at 86, if no carry instruction 78 is again executed. With a carry at 86, SR3 is initialized ot its original value; instruction 78 is then executed.

The above described counting loop is repeated until K=0 at 89. Pulse generation activities corresponding to operation of circuit 31 of FIG. 1 then begin. First at 90, mask pointer for a mask is obtained. The mask (a bit pattern) is loaded into processor 49 at 92. The mask type or set is checked at 93. The mask-count compare (same as AND circuit 34 of FIG. 1) at 94, 95, 96 is made. At branch instruction 100, equality is checked. If there is inequality, then there is no pulse to be generated and instructions 102, 103, 92, 93 and 94, 95 or 96 are repeated until all time outs have been checked. This sequence is determined by the number of masks to be checked.

If there is a compare equality at 100, then at 100, a time out pulse is posted corresponding to line 32' to be used by an output routine (not shown but in other programs 55) generate a pulse on a line 52. Then the number of output pulses that have been generated can be tallied and stored. This pulse generating loop is repeated until all checks have been made as indicated by the end of the mask table, instruction 103.

While the invention has been particularly shown and described with reference to preferred embodiments thereof, it will be understood by those skilled in the art that various changes in form and detail may be made therein without departing from the spirit and scope of the invention.

We claim:

1. A timing interval generator;

means for generating clock pulses having a predetermined periodicity;

plural interval means connected to said clock pulse generating means for defining a plurality of timing intervals simultaneously, each interval being a multiple of the periodicity of said clock pulses, each said interval means having a multibit set of signals indicative of a present interval being defined;

plural multibit register means connected to said plural interval means, respectively, for simultaneously memorizing a last measured interval for each of said plural interval means;

plural mask means each for storing a plurality of multibit masks; and means connected to said plural multibit register means and to said plural mask means for comparing all of said multibit masks in each of said mask means to each of said register means, respectively, for detecting and indicating mask-selected plurality of said intervals when the multibit mask equal to the time interval stored in the interval means.

2. The generator set forth in claim 1 wherein said plural interval means include a plurality of cascade-connected multibit shift registers, each of said multibit shift registers having a predetermined shiftable signal pattern of 1 bit, a first one of said shift registers receiving said clock pulses for shifting the signal contents thereof and emitting a carry pulse when a 1 bit has reached a predetermined position in said first one shift register;

a second of said shift registers receiving said carry pulse as an input shift pulse for shifting the signal contents thereof and in turn having a carry output for applying a shift pulse to a next succeeding one of said shift registers; and each of said shift registers individually containing a multibit pattern and supplying same to said plural multibit register means, respectively.

3. The timing interval generator set forth in claim 1 or claim 2 wherein said compare means includes plural register-scanning means for scanning said plural multibit register means for fetching said multibit patterns in a predetermined sequence; and mask-scanning means operatively associated with said plural mask means for scanning said plural masks for fetching multibit mask patterns;

said compare means coincidentally receiving said fetched multibit patterns and multibit masks in said sequences and checking for coincidence and supplying an indication upon detection of such coincidence; and means responsive to said indication to supply a timing pulse.

4. The timing interval generator set forth in claim 3 wherein said plural mask means store a plurality of multibit masks for each of said plural multibit register means; and said plural-register scanning means including means connected to said mask-scanning means for scanning a plurality of multibit masks for each multibit pattern stored in each of said plural multibit registers.

5. The timing interval generator set forth in claim 1 and adapted to be connected to a programmed digital computer;

input output means connecting said computer to said means for generating clock pulses for supplying bit patterns for determining an interval of said clock pulses;

means connecting said computer to said plural interval means for transferring said multibit patterns to said plural interval means, respectively, for defining durations of said plurality of timing intervals, respectively;

means connecting said computer to said plural mask means for transferring a plurality of multibit mask sets of signals to said plural mask means for determining intervals between successive timing pulses; and input means in said computer and being connected to said clock pulse generating means for receiving said clock pulses.

6. The method of generating a plurality of timing pulses;

including the steps of:

generating a series of clock pulses for timing pulse generation;

generating a first multibit pattern from said clock pulses;

when said first multibit pattern reaches a predetermined multibit pattern state supplying an output timing pulse and generating a second multibit pattern from said output timing pulse and repeating the number of multibit patterns generated up through a predetermined number of said multibit patterns;

each time a clock pulse is supplied for said first multibit pattern simultaneously memorizing each and every multibit pattern that is generated;

comparing each of said memorized multibit patterns with a plurality of multibit masks for detecting coincidence between the multibit pattern and the multibit mask; and for each coincidence detected, supply a timing pulse such that a series of timing pulses are generated in accordance with the generated multibit patterns and said masks.

7. The method set forth in claim 6 further including setting a plurality of patterns in said multibit pattern generators for altering the generated timing intervals independent of said multibit masks.

8. The method set forth in claims 6 or 7 including altering said multibit masks independent of said plural multibit patterns for altering the interval of the timing pulses being generated.

9. A timing interval generator including an oscillator for generating a succession of timing pulses;

a processor for executing programs of instructions;

a memory attached to said processor for containing programs of instructions;

output means connected to said processor for receiving generated timing pulses;

said memory means containing a series of programs of computer instructions means in said processor responsive to said computer instructions and to said oscillator timing pulses for generating a series of multibit patterns and means in said processor to capture a plurality of said multibit patterns simultaneously and separately memorize same for each received timing pulse; and further program means for comparing a plurality of multibit masks with each of the captured multibit patterns and upon coincidence between one of the multibit masks and one of the captured multibit patterns enabling said processor to emit a timing pulse.

* * * * *